United States Patent [19]
Waehner

[11] 3,909,701
[45] Sept. 30, 1975

[54] LINEAR ENERGY CONSERVATIVE CURRENT SOURCE

[75] Inventor: Glenn C. Waehner, Riverside, Conn.

[73] Assignee: United Aircraft Corporation, East Hartford, Conn.

[22] Filed: Oct. 3, 1974

[21] Appl. No.: 511,884

[52] U.S. Cl. ............... 323/4; 315/411; 317/DIG. 4; 317/DIG. 6; 323/23; 323/DIG. 1; 330/13; 330/40

[51] Int. Cl.[2] ................. H03K 17/64; H03K 17/66; G05 1/56

[58] Field of Search ........... 315/395, 396, 397, 403, 315/404, 405, 406, 407, 408, 411; 317/DIG. 4, DIG. 6; 323/1, 4, 16, 17, 19, 22 T, 23, DIG. 1; 330/13, 15, 22, 40

[56] References Cited

UNITED STATES PATENTS

| | | | |
|---|---|---|---|
| 3,582,734 | 6/1971 | Bryden | 317/DIG. 4 |
| 3,772,606 | 11/1973 | Waehner | 330/13 |
| 3,801,858 | 4/1974 | Grangaard et al. | 330/40 UX |

*Primary Examiner*—A. D. Pellinen
*Attorney, Agent, or Firm*—M. P. Williams

[57] ABSTRACT

A regulated energy-conservative current source including a large inductance provides substantially all of the desired current to a deflection yoke or other load by modulation of an electronic switch which is turned on in response to the current drawn by an amplifier being above an upper threshold and is turned off in response to the amplifier current being below a lower threshold. Feedback of the load current controls the amplifier to make up the difference between the desired current and that supplied by the large inductance. Embodiments include a trigger, a differential amplifier with positive feedback, and windings coupled to the large inductance. As an energy saving adjunct in a magnetic deflection system for a CRT, bipolar embodiments, employing a single large inductance with duplicate other apparatus, provide regulated current of either polarity or zero magnitude. External feedback and local feedback embodiments are disclosed.

9 Claims, 5 Drawing Figures

LINEAR ENERGY CONSERVATIVE CURRENT SOURCE

BACKGROUND OF THE INVENTION

1. Field of Invention

This invention relates to energy conservative current sources and particularly to linearlyresponsive energy conservative current sources.

2. Description of the Prior Art

The use of magnetic deflection in cathode ray display systems of many types is well known. One reason for preferring magnetic deflection is the superior brightness and resolution characteristics which may be obtained thereby. However, magnetic deflection systems consume considerably more power than do electrostatic systems. The current provided to a deflection yoke associated with a CRT must normally vary from some negative value (for deflection to one edge of the screen), through zero (for deflection at the center of the screen), to a high positive value (for deflection at the opposite edge of the screen). Since the deflection must be in accordance with the desired picture, it must be provided by a linear amplifier working with suitable positive and negative voltage supplies. If deflection is to change extremely rapidly, then the power supplies must additionally be of relatively high voltage, to drive the inductive yoke. But, when the rate of change in current to the yoke is relatively low, then the driving voltage must be relatively low; the yokedriving output amplifier must therefore drop considerable voltage over a considerable portion of the time while supplying substantial current. This is what consumes the power.

To conserve energy, the use of energy-conservative, modulated power supplies is known. These conserve energy by duty-cycle modulation of a current supplied to the load. Such power supplies are either full-on or full-off. When full-on, they are like a switch which is closed in making a very low resistance connection, so that the passage of a large current therethrough does not dissipate much power. When they are full-off, there is no current flow so there can be no power dissipated. By causing the power supply to be on for a correct percentage of the time, at a fairly high switching rate or frequency, the average current can be controlled with relatively small power losses within the power supply itself. However, devices of this type adequately controlled in terms of a faithful, linear current representation of an input control signal, as is required for high quality CRT display systems, have not been provided.

SUMMARY OF INVENTION

An object of the invention is provision of improved energy-conservative amplifier apparatus. Another object is provision of energy conservative current sources operable in response to a wide variety of input demands.

According to the present invention, the power supply current provided to the power output stage of a load driver, such as a regulated power supply or an amplifier, is monitored, and an electronic switch is closed in response to current in excess of a given amount, and opened in response to current below a lesser amount to commutate current to a large inductance, which supplies current to a load (such as a deflection coil of a cathode ray tube display), and feedback control over current through the load causes the load driver to provide just the right amount of current for summation with the commutating current from the large inductance so as to maintain desired load current as indicated by an input voltage. The feedback may be local (as in a Darlington amplifier) or external. In accord with the present invention, the current responsive means for operating the electronic switch has hysteresis, whereby the switch is turned off in response to current of a lesser magnitude than the current required to turn the switch on, thereby to cause commutation of current in the inductance, for energy conservation.

In accordance further with the present invention, the current monitoring means may comprise a current sensor operating a Schmidt trigger. In still further accord with the present invention, the current monitoring means may comprise a differential current amplifier operating an intermediary switch, which switch provides feedback to the differential current amplifier. In accordance still further with the present invention, the current monitoring means may comprise a small winding coupled to the large inductance, whereby current flow through the large inductance provides positive feedback to the electronic switch.

According to the present invention in one important form, current fed to a deflection yoke through a large inductance is modulated in accordance with the current demand of the deflection yoke, the modulation being such as to provide average currents in the yoke which are very nearly the complete current requirements of the yoke, to the extent that the current in the large inductance can change rapidly enough to accommodate demanded changes of current in the yoke.

By avoiding large current in load drivers, such as power supplies and linear deflection amplifiers, except during transitions, the power consumption of the load drivers is substantially reduced. Utilization of on/off type duty cycle modulation of the current in the large inductance avoids concurrent current and voltage in the energyconserving current supply, thereby to reduce overall deflection system power consumption by substantially an order of magnitude.

Other objects, features and advantages of the present invention will become more apparent in the light of the following detailed description of preferred embodiments thereof, as illustrated in the accompanying drawing.

DESCRIPTION OF THE PREFERRED EMBODIMENT

Figure 1:
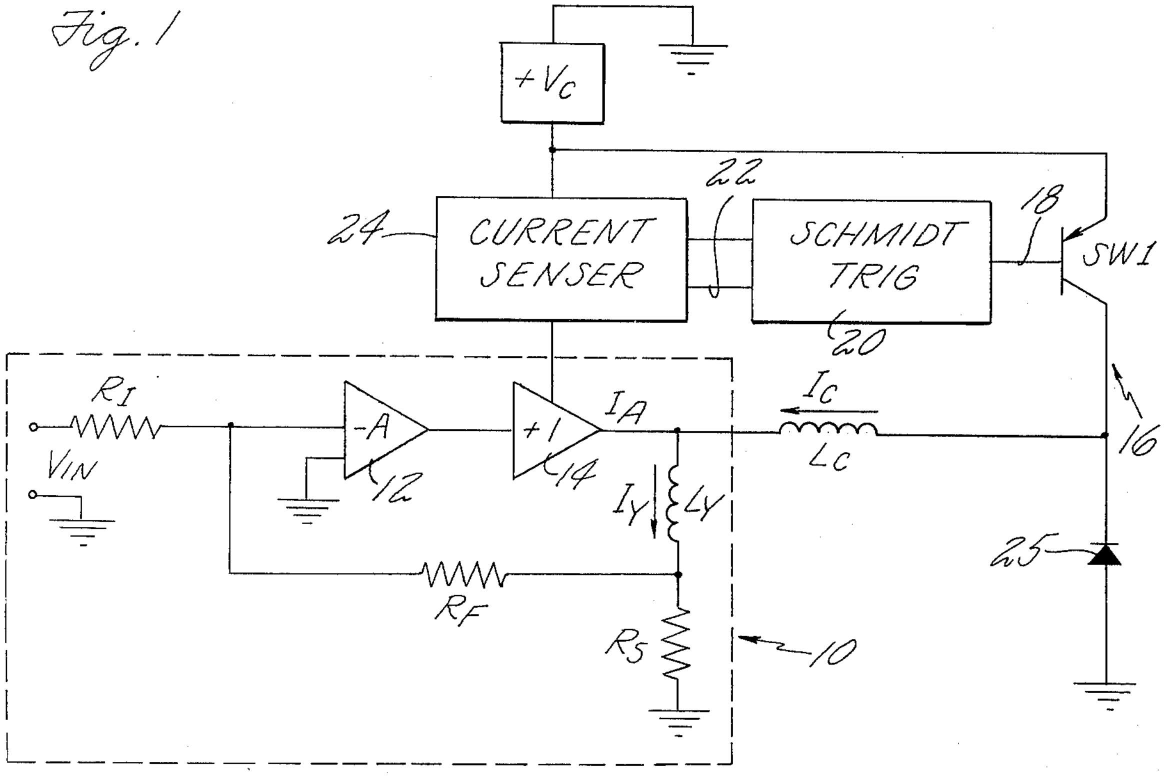
FIG. 1 is an illustrative, simplified schematic block diagram of a unipolar embodiment of the present invention.

Referring now to FIG. 1, a typical magnetic deflection system 10 includes a yoke $L_Y$ in series with a feedback resistor $R_S$ across which a feedback voltage is taken through a feedback resistor $R_F$ for connection at a summing junction with an input resistor $R_I$ to which a deflection demanding input voltage $V_{IN}$ is fed. The junction feeds a high gain linear amplifier 12 which in turn feeds an output power amplifier 14 that delivers current to the yoke $L_Y$. Absent any other apparatus (such as that described hereinafter with respect to the present invention), the current output $I_A$ of the amplifier 14 comprises the current $I_Y$ through the yoke $L_Y$, which also is the current to the sensing resistor $R_S$. The voltage across the sensing resistor is therefore a linear function of the current through the yoke $L_Y$.

In accordance with the present invention, an auxiliary energy-conservative current module 16 includes a relatively large inductance $L_C$ which is connected to a node to provide current $I_C$ to the yoke $L_Y$, thereby reducing the current requirement of the amplifier 14. The current in the large inductance $L_C$ is regulated by modulating the application of voltage thereto from a voltage source $+V_C$ by means of an electronic switch, such as a power transistor SW1. The switch SW1 is turned on by a signal on a line 18 connected to its base from the output of a Schmidt trigger 20, which in turn is triggered on and off in response to the voltage level on a pair of lines 22 from a current sensor 24 connected in series between the power supply $+V_C$ and the power amplifier 14.

When the power amplifier 14 commences drawing current above some small given magnitude, the current sensor 22 provides a voltage in excess of the triggering threshold voltage to turn on the Schmidt trigger 20, thereby providing a signal on the line 18 to turn on the switch SW1, so current flows from the power supply $+V_C$ into the large inductance $L_C$. This current is added to the current $I_A$ from the power supply 14 to make up the total yoke current $I_Y$ which causes a proper voltage across the sensing resistor $R_S$ to null with the input voltage applied to the resistor $R_I$. Because some of the current is being supplied by the energy-conservative module 16, the amplifier 14 provides less current $I_A$ to the choke $L_Y$. When this current reduces (as a result of buildup of current in the large inductance $L_C$) to a sufficiently small magnitude such that the voltage on the lines 22 falls below the lower threshold of the Schmidt trigger 20, the Schmidt trigger 20 then turns off so that the signal on line 18 disappears and the switch SW1 becomes open. When the switch is cut off, the current through the large inductance $L_C$ is maintained after it flows downward through the yoke $L_Y$ and the sense resistor $R_S$ to ground, by flowing upward from ground through a diode 25. By causing the turnoff voltage of the Schmidt trigger 20 to be lower by some given amount than its turn on voltage, the switch SW1 can be controlled so as to supply current to the large inductance $L_C$ of a proper magnitude so that the current output $I_A$ of the amplifier 14 can cycle between some low value (at which relatively small power consumption exists) and nearly zero (for steady current demands), as is illustrated more fully with respect to FIG. 2. Therein, illustration (a) is a representation of an exemplary deflection demand voltage $V_{IN}$ and illustration (b) is a representation of approximate yoke current $I_Y$ which results therefrom. Basically, the yoke current $I_Y$ is a faithful reproduction of $V_{IN}$, except for extremely rapid changes in $V_{IN}$ which, depending upon the maximum voltage in the system, the yoke may not be able to follow faithfully. The amplifier current $I_A$ is shown in illustration (c): as $V_{IN}$ starts to increase from zero, the amplifier current increases commensurately. However, when it reaches a threshold level (point 26, FIG. 2) the current sensor 24 turns on the Schmidt trigger 20 which turns on the switch SW1, causing the power supply $+V_C$ to be connected to the large inductance $L_C$ so current starts to flow in it. If the relationship between the power supply, the large inductance $L_C$, and the rise time of $V_{IN}$ is such that the current in the large inductance $L_C$ can rise as rapidly as is demanded by $V_{IN}$, then the current in the large inductance $L_C$ will simply trail the current demand for the yoke, and a steady state current will be provided by the amplifier 14 (after the point 26). Once $V_{IN}$ levels off (such as at point 28 of illustration (a)), the current in the large inductance $L_C$ eventually reaches substantially the current $I_Y$ required in the yoke. This causes a reduction in current supplied by amplifier 14 so there is reduction of its current drain on the power suppy $V_C$. This is sensed by the current sensor 24 which causes the Schmidt trigger 20 to turn off, thereby opening the switch SW1. The current in the large inductance $L_C$ therefore starts to decay as shown by point 30 of illustration (d) of FIG. 2. This in turn causes the current in the amplifier to increase in order to maintain a constant average current $I_Y$ (illustration (b)); however, if the current $I_A$ goes up, it again reaches the magnitude required in order to turn on the Schmidt trigger 20 so that switch SW1 is again closed, thereby connecting the power supply $+V_C$ to the large inductance $L_C$. As a result, current in $L_C$ again starts to build up so that the current through the choke $L_Y$ consists of a greater and increasing amount of current $I_C$ so that the current $I_A$ of the amplifier 14 again can decrease. Cycling in this manner will continue as long as the current requirements dictated by $V_{IN}$ remain constant.

Figure 2:
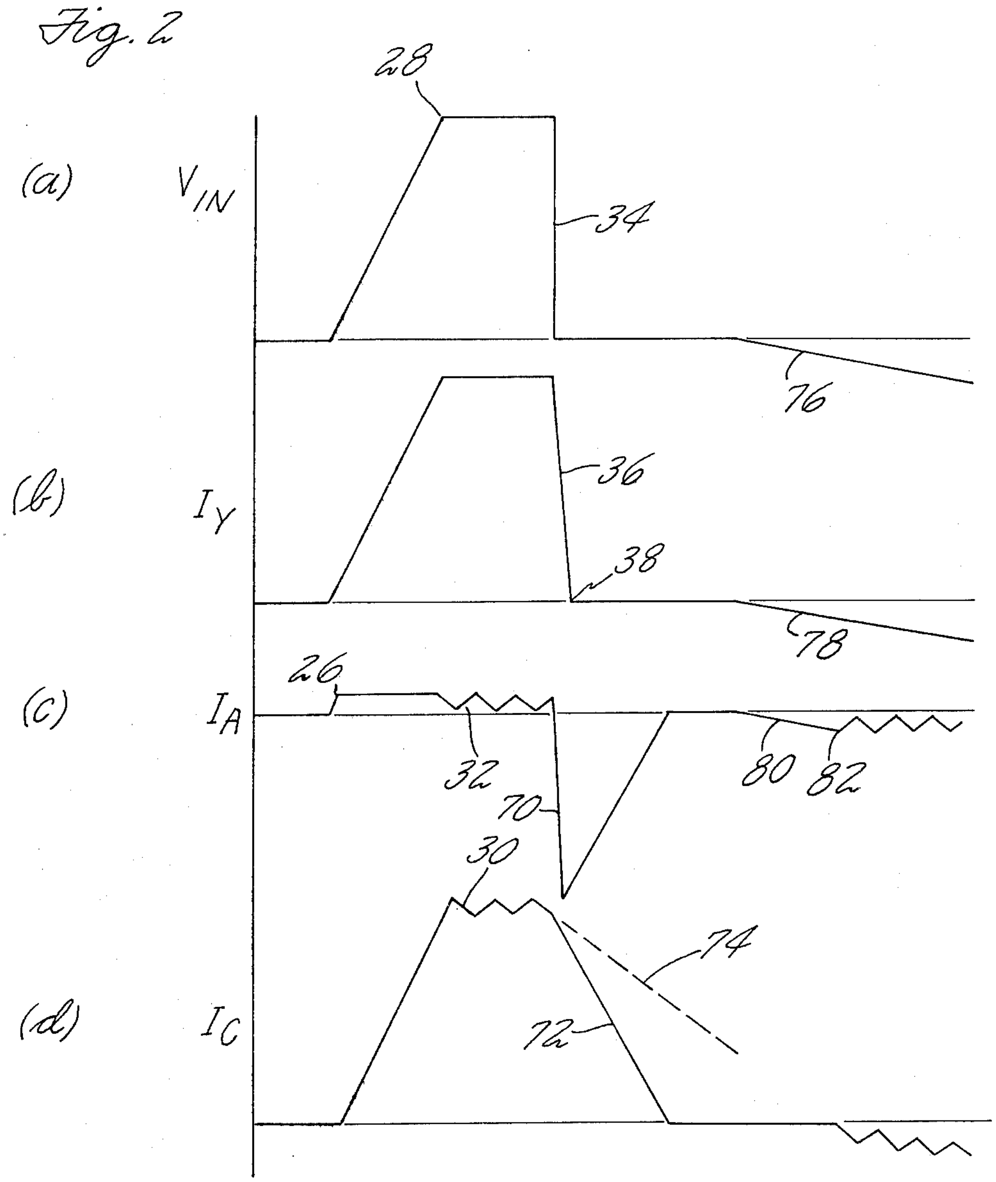
FIG. 2 is an illustration of current and voltage relationships in the embodiment of FIG. 1.

If $V_{IN}$ should drop at a very high rate, as indicated by the point 34 in illustration (a) of FIG. 2, it may be that the amplifier 14 cannot follow this demand too closely and the resulting change in yoke current $I_Y$ may lag behind the input voltage $V_{IN}$ as indicated generally by point 36 of illustration (b). Because the current in the large inductance (in the positive sense of $I_C$ and $I_Y$) will decay only slowly, it is necessary for the amplifier to supply a large negative current $-I_A$ to the junction so that the total current $I_Y$ through the yoke $L_Y$ will rapidly decrease to zero as seen at point 38 in illustration (b). As soon as this negative current starts to flow in a magnitude greater than the threshold magnitude, it would be desirable to be able to apply a negative voltage to the large inductance $L_C$ so as to drive its current in a more negative direction, in opposition to the positive current therethrough, so as to more quickly reduce that current to zero. For this reason, the present invention is more practically implemented in bipolar form, as is the case in the illustrative embodiments of FIGS. 3 and 4 described hereinafter.

Figure 3:
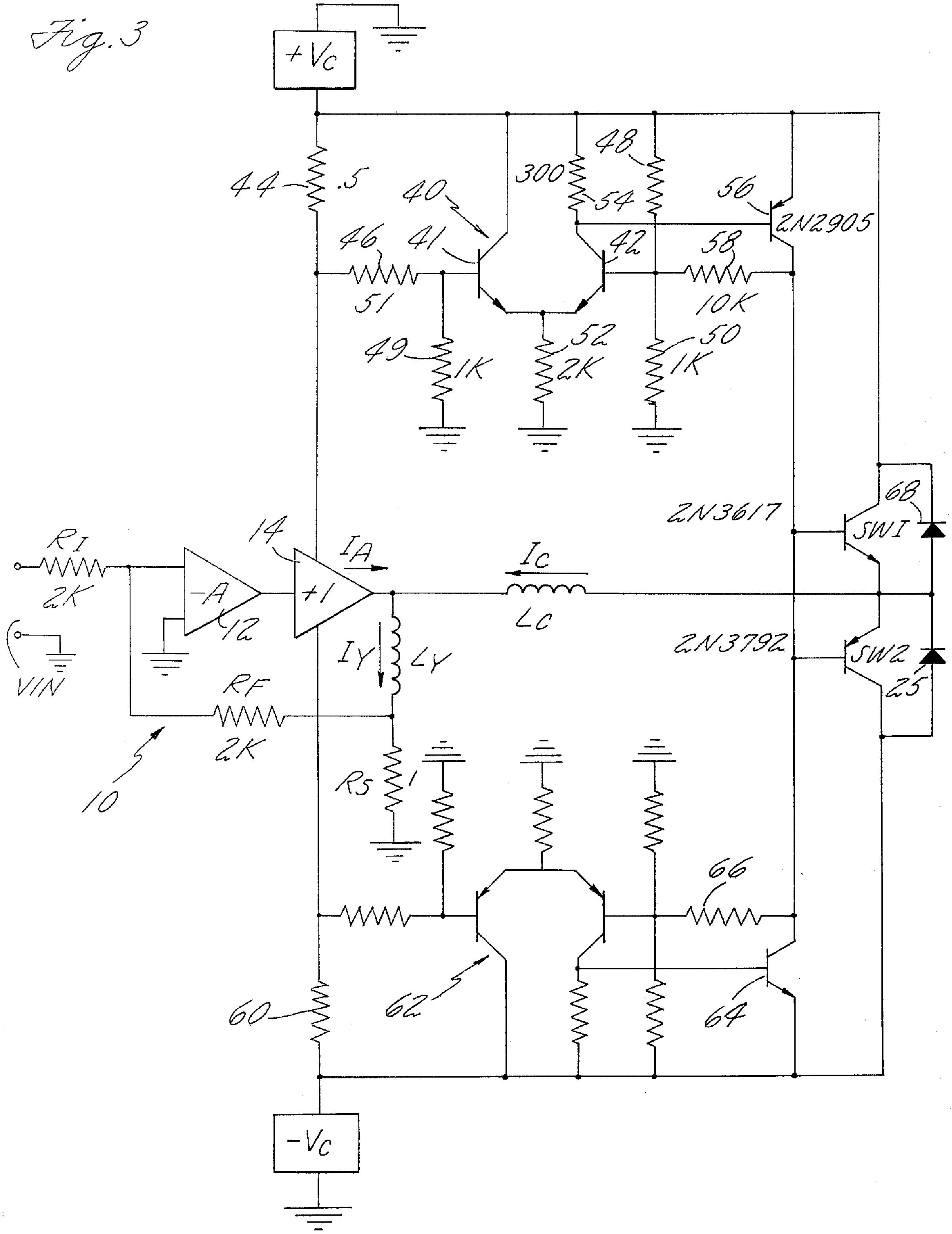
FIG. 3 is a schematic diagram of a differential current sensor embodiment of the present invention.

In the illustration of a second embodiment of the invention in FIG. 3, elements like those of FIG. 1 are identified with like references. Therein, a differential current amplifier 40 includes a pair of NPN transistors 41, 42 in common emitter configuration. A small resistor 44 (which may be on the order of a half ohm) is connected in series between the amplifier 14 and the power supply $+V_C$ to serve as a current sensor. Voltage developed across the resistor is applied through a resistor 46 to the base of the transistor 41 and a grounded resistor 49. A similar voltage is developed for the base of the transistor 42 by a resistor 48 in series with a grounded resistor 50, the junction thereof being connected to the base of the transistor 42. Normally, the transistor 41 is conducting and the transistor 42 is cut off, the level of conduction being established by the voltage division of the resistor 44, 46, 49 for the transistor 41 (and by the resistors 48, 50 for the transistor 42). However, once current begins to flow through the resistor 44, there is an inordinate voltage drop through it such that the base of the transistor 41 decreases which causes less emitter current to flow through the common emitter resistor 52 so that the emitters go more negative, while the base of the transistor 42 stays at approximately the same potential. This has the same effect as the base going more positive, so that transistor 42 commences conduction, causing a significant drop across its collector resistor 54. This causes the base of a PNP transistor switch 56 to become more negative than its emitter so that the switch 56 turns on, providing more current to the resistor 50 through a feedback resistor 58, so that the base of transistor 42 becomes further positive, driving it into saturation and in turn driving transistor 56 into saturation, in a toggling fashion. With the switch 56 full on, positive potential is applied to the base of switch SW1 causing it to turn on so as to connect the voltage supply $+V_C$ directly to the large inductance $L_C$, whereby current will begin to increase in the large inductance $L_C$. The current in the large inductance $L_C$ is added to yoke current, so that less current $I_A$ need be supplied to the yoke by the amplifier 14. Thus there is a commensurate decrease in the current from the power supply passed through the resistor 44, so that the voltage at the base of the transistor 41 will begin to rise. However, due to the feedback through the resistor 58, the transistor 42 is saturated, so that there is a large positive voltage at the common emitters due to current flow through the resistor 52. Thus the current through the resistor 44 will have to decrease to a point lower than that at which it turned on the transistor 41 before it can commence to turn off the transistor 41. However, when the current through the resistor 44 is nearly zero, voltage at the base of transistor 41 is sufficiently positive to cause its conduction to provide enough current to the common emitter resistor 52 to raise the emitters such that the transistor 42 reduces its conduction considerably, causing a substantial increase in voltage at its collector which in turn shuts off the PNP transistor 56, thereby removing positive feedback to the resistor 58, so that the transistor 42 achieves a very low level of conduction. With the transistor 56 cut off, SW1 is turned off and current flows from ground up through a negative power supply $-V_C$ via the diode 25 to the return side of the large inductance $L_C$. As the current through the large inductance $L_C$ begins to decay, more and more of the current for the yoke will be provided by the amplifier so there will be an increase of current through the sensing resistor 44 until such time as the voltage at the base of transistor 41 again decreases to the point where its conduction is significantly curtailed, changing the emitter bias on the transistor 42 so that it begins to conduct heavily, as described hereinbefore.

Thus, the differential current amplifier 40, together with the transistor switch 56, will cause cycling in the same fashion as described with respect to the embodiment of FIG. 1 hereinbefore.

In FIG. 3 there is a second current sensor comprising the resistor 60 connected between amplifier 14 and a negative power supply $-V_C$. This in turn controls the differential current amplifier 62 which operates in the same fashion as the differential current amplifier 40, to operate the transistor switch 64, which cooperates through the feedback resistor 66 to cause the current amplifier to toggle full on or full off as described with respect to the current amplifier 40, to in turn control a main transistor switch SW2, which has a diode 68 for a return path. The bilateral configuration of FIG. 3 is not only useful to permit currents of an opposite polarity ($-I_Y$) to the magnetic reflection yoke $L_Y$, but is also useful causing the current $I_Y$ to be driven to zero more rapidly than in the unilateral embodiment described with respect to FIG. 1 (through simple decay). Referring to FIG. 2, in order to cause the apparatus of FIG. 3 to follow the drop in input voltage (point 34) as nearly as possible, the amplifier current $I_A$ (illustration (c)) goes highly negative by turning on the switch SW2 and when this happens, the slope of decrease (illustration (d)) in the inductor current $I_C$ increases significantly so that the current therein reduces to zero more quickly (point 72) than its natural decay rate (shown by the dotted line at point 74). As the current to the inductor approaches zero, the negative current required by the amplifier 14 to cause the yoke current to be zero decreases until both currents are again zero.

Referring to the right-hand side of FIG. 2, a negative deflection is demanded by negative voltage of $V_{IN}$ (point 76) to achieve a total increasingly negative current $I_Y$ as shown at point 78. This is initially provided by the amplifier 14, illustrated at point 80, but once the amplifier reaches the threshold current to the sensing resistor 60 (FIG. 3), which occurs at point 82, then the negative portion of the energy-conservative current supply (the bottom half of FIG. 3) operates to supply negative current ($-I_C$) through $L_C$ for addition with the negative current ($-I_A$) for application to the deflection yoke $L_Y$. The switch SW2 is turned on and off in response to current buildup and current decay through the sense resistor 60, as is described hereinbefore with respect to the positive current.

Figure 4:
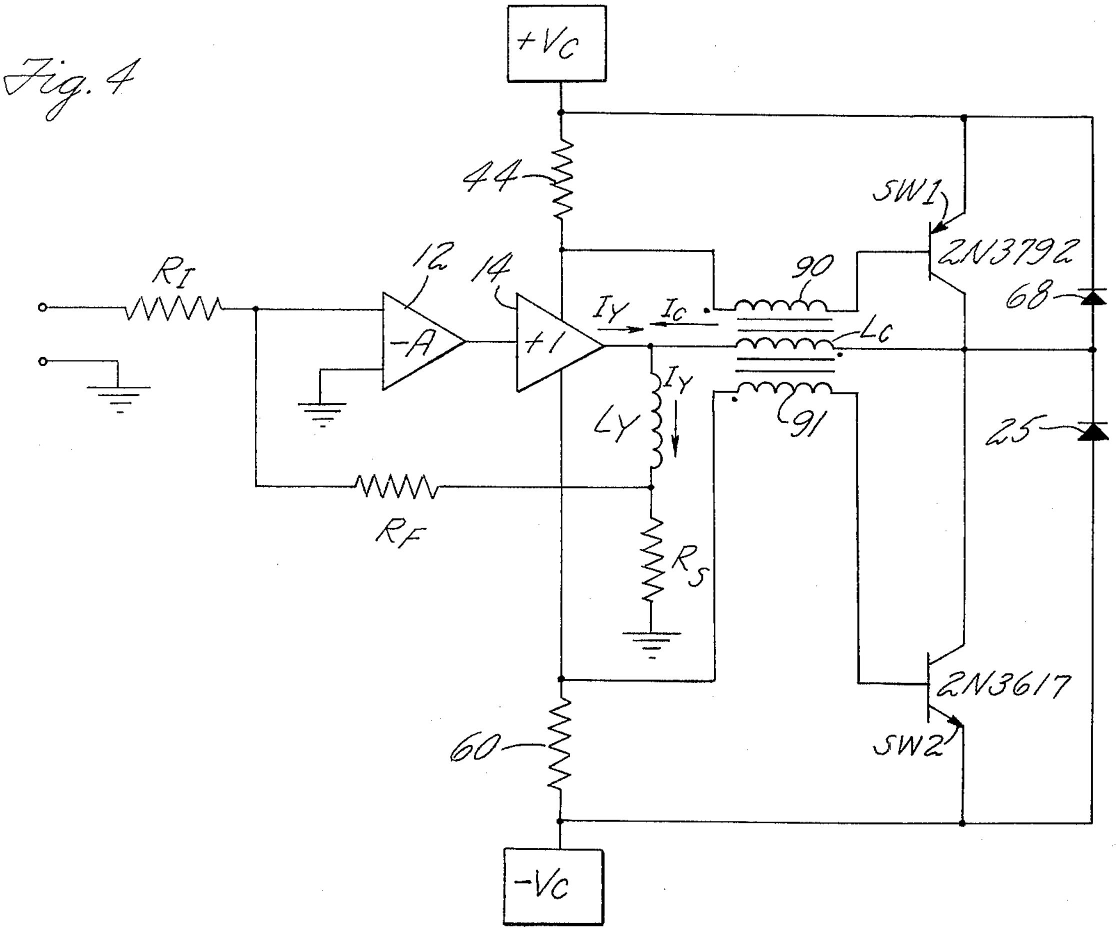
FIG. 4 is a schematic diagram of an inductive coupling embodiment of the present invention.

A simpler embodiment of the present invention is illustrated in FIG. 4, in which elements are identified by similar references to like elements in the previous figures. In FIG. 4, each half of the energy-conservative current supply requires only the sensing resistor, the switch and the return diode, together with a winding 90, 91 magnetically coupled to the large inductance $L_C$. The windings 90 and 91 are coupled as shown by the dot notation such that increasing positive current, in a direction shown as $I_C$ FIG. 4, will cause a negative voltage to be induced at the base of switch SW1, and increasing negative current (opposite to that shown as $I_C$ in FIG. 4) will cause a positive voltage to be coupled to the base of switch SW2. In this fashion, once a sufficient current has been sensed by the related sensing resistor 44, 60 one of the switches SW1, SW2 will commence to flow current through the large inductance $L_C$, and this buildup of current will in turn induce a feedback voltage to the base of the related switch SW1, SW2 causing it to go full on. This provides the necessary hysteresis that insures that the switches SW1, SW2 are full on or full off at all times.

Switches SW1 and SW2 may respectively comprise a 2N3716 and a 2N3792 which have a base/emitter turn on bias on the order of seven-tenths of a volt, and it will be highly saturated at about eight-tenths of a volt. Thus, it takes a relatively small amount of coupling and a relatively small change in the current through the large inductance $L_C$, once the sensing resistor 44 has applied approximately seven-tenths of a volt to the base of switch SW1, in order for switch SW1 to be hard driven into saturation. Similarly, switch SW1 will not begin to turn off until the current through the sensing resistor 44 goes below the value which with the voltage provided by the winding 90 would provide seven-tenths of a volt to the base of switch SW1. It should be borne in mind that as long as the power supply $+V_C$ is connected through switch SW1 to the large inductor $L_C$ the current will continue to increase in $L_C$ (with any reasonable duty cycle). Thus there is always negative voltage applied by the winding 90 to the base of switch SW1, even just prior to the turnoff of switch SW1, as a result of decay in power supply current drawn to the amplifier 14 through the resistor 44. However, once switch SW1 does start to turn off as a result of very small current through the resistor 44, the decrease in current to the large inductance $L_C$ will induce a positive voltage through the winding 90 to the base of the switch SW1, driving it fully off almost instantaneously.

The current sources of the embodiments of FIGS. 1, 3 and 4 are energy conservative because the current supplied through the large inductance $L_C$ is applied across switch SW1 or SW2 when they are in full saturation, so the power consumption is a current multiplied only by the saturation voltage of the transistor, which is quite small. On the other hand, when there is large voltage drop between the power supply and the large inductance $L_C$, this is due to the switches SW1 and SW2 being open, so there is no current drain through the switches, and therefore no power consumption. This is in contrast to linear amplifiers in which all the voltage in the supply must be dropped at the current being supplied across the full range of the power supply voltage, in dependence upon the instantaneous current demand and the voltage required to provide it.

In the simple embodiment of FIG. 1, the hysteresis is provided internally of the Schmidt trigger itself, which has a higher turn-on threshold voltage than turn-off threshold voltage. In the embodiment of FIG. 3, the hysteresis is provided by the positive feedback of the resistors 58, 66 which, in response to initial turn on of one of the transistor switches 56, 64 will in turn feed back to the output transistor of the differential current amplifier 40, 62 to cause saturation of the transistor switch 56, 64. Similarly, initial turnoff of the transistor switches 56, 64 result in feedback which drives them off. In the embodiment of FIG. 4, the hysteresis is provided by the windings 90, 91, as described hereinbefore.

In the embodiment of FIG. 3, the switch SW1 may be a 2N3716 and the switch SW2 may be a 2N3792. The bases of the two switches are connected together so as to prevent both of them from turning on at the same time, which would short circuit the power supplies. In FIG. 4, these switches are not connected in common emitter configuration, so it is not possible to connect their bases together in order to prevent both of them turning on at once. Therefore, it is necessary that sensing resistors 44, 60 be sufficiently small so that there is a safe margin of the turnoff of one of the transistors (due to a decreasing current of one polarity) before turn on of the other transistor (due to increasing current of the other polarity). Thus, if the sensing resistors are one-half ohm in FIG. 3, they may be one-fourth ohm or thereabouts in FIG. 4. Certainly, the selection of the detailed parameters is well within the skill of the art in the light of the teachings herein.

Figure 5:
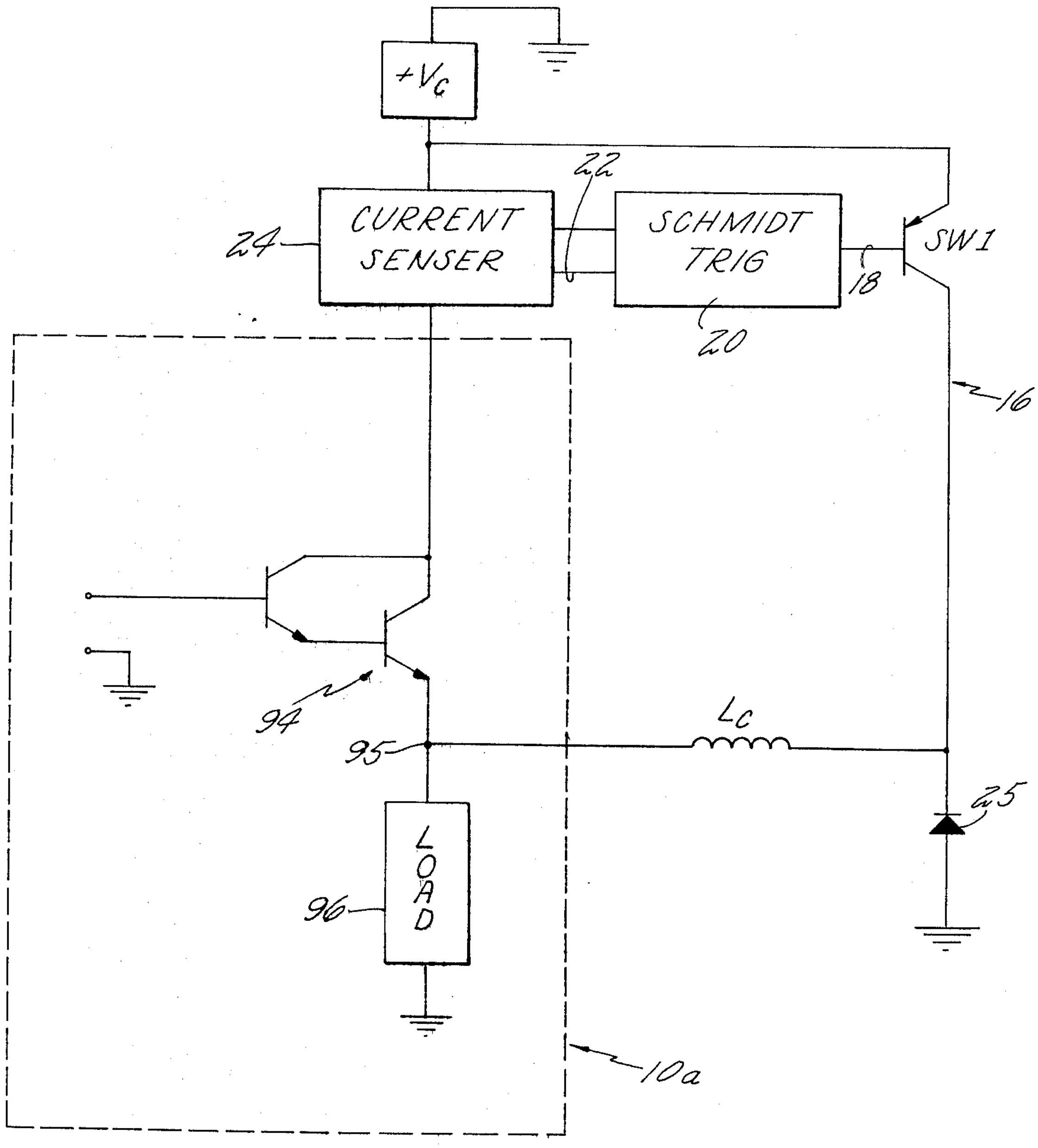
FIG. 5 is a simplified schematic block diagram of a local feedback embodiment of the invention.

Although the embodiments of FIGS. 1, 3 and 4 show explicit, external feedback, the invention is also operable with respect to amplifier stages which have local feedback, as shown in FIG. 5. A compound emitter follower stage 94, such as that commonly referred to as Darlington amplifier, has local feedback as a consequence of the transistor configuration (94), whereby adding current into the emitter node 95 from the large inductance $L_C$ has the same effect in the amplifier/load combination **10*a* (FIG. 5) as in the deflection amplifier systems 10 of the previous embodiments. Note that the energy conservative module 16 in FIG. 5 is identical to that described with respect to FIG. 1.**

Similarly, although the embodiments herein have been principally described with respect to linear deflection amplifiers, it should be understood that amplifiers useful for other purposes and other output amplification stages (such as the final driving stage in a regulated power supply or in a constant current source) may also be connected with an energy conservative module of any of the embodiments described herein, with a concomitant savings in power consumption.

It should be understood that the energy conservation comes about, in part, from the fact that the electronic switch (SW1) is either full on when carrying current, therefore having only a small forward bias voltage drop and low energy consumption, or it is full off so no current is flowing therethrough. The conservation also comes about from the fact that when the electronic switch is turned off, the large inductance $L_C$ either will supply current to the specifically driven load (such as $L_Y$ or load 96) or will supply current to the driving power supply or to other circuits driven by the driving power supply. If the driving power supply has a large capacitive output, energy can be returned to the output capacitor of the power supply; in other cases, energy can be supplied by the large inductance to other circuits, thereby reducing the power drain on the power supply.

Thus, the various embodiments of the present invention provide energy conservation by sensing currents in a load driver stage and providing commutated current, by means of hysteresis, into a node which the driver stage is feeding, with feedback (local or otherwise) to commensurately reduce the currents provided by the load driver stage (in most cases), so that the total current provided by the load driver stage and the energy conservative module will be the desired total current.

Although the invention has been shown and described with respect to preferred embodiments thereof, it should be understood by those skilled in the art that the foregoing and various other changes, omissions and additions thereto may be made therein without departing from the spirit and the scope of the invention.

Having thus described typical embodiments of my invention, that which I claim as new and desire to secure by letters Patent is:

1. An energy conservative current source comprising:

a current load;

an amplifier stage connected to said current load at a node and having feedback indicative of current supplied to said node and responsive to an input signal and said feedback to provide current to said load commensurate with said input signal;

a DC power supply and a current sensor connecting said DC power supply to said amplifier stage;

an inductance having one end connected to said current load at said node;

an electronic switch connected between said power supply and the other end of said inductance;

switch control means responsive to current flow between said power supply and said amplifier in excess of a given magnitude for turning on said electronic switch and responsive to current flow between said power supply and said amplifier of a magnitude less than said given magnitude for turning off said electronic switch; and means to provide a path for current flow through said inductance when said electronic switch is turned off.

2. A current source according to claim 1 wherein said last named means comprises a unilateral conducting path connected from the return side of said power supply to the other end of said inductance and poled to conduct current to said inductance in the same polarity as current conducted through said electronic switch from said power supply.

3. A current source according to claim 1 wherein said switch control means comprises a Schmidt trigger.

4. A current source according to claim 1 wherein said switch control means comprises a differential current amplifier, responsive to said current sensor and to a voltage divider connected to said power supply, and a transistor switch responsive to said amplifier, the output of said transistor switch providing a turn-on signal for said electronic switch and providing feedback to said current amplifier to cause it to turn full on or full off in response to variations in current in said current sensor.

5. A current source according to claim 1 wherein said switch control means comprises a winding magnetically coupled to said inductance and poled with respect to said inductance in such a fashion that an increase in current in said inductance induces a voltage in said winding of a polarity to turn said electronic switch full on, said winding connected between said current sensor and said electronic switch.

6. An energy conservative bipolar current source comprising:

a current load;

a bipolar amplifier operable with respect to bipolar working voltages applied to inputs thereto and responsive to a feedback signal from said current load and to an input signal to provide current to said load commensurate with said input signal:

a pair of current sensors;

a positive DC power supply and a negative DC power supply connected through respective ones of said current sensors to corresponding voltage inputs of said amplifier;

an inductance having one end connected to said current load and the other end connected through respective electronic switches to each of said two power supplies;

a pair of switch control means, each responsive to current of a given magnitude in one of said current sensors to turn on the related one of said electronic switches and responsive to current of a magnitude less than said given magnitude in the related one of said current sensors for turning off the corresponding one of said electronic switches; and means providing paths for current to flow in either direction through said inductance when said electronic switches are turned off.

7. A current source according to claim 6 wherein said last named means comprises:

a unilaterally conductive path shunting each of said electronic switches and poled to conduct current in the direction opposite to the conduction of current to said inductance through the one of said electronic switches shunted thereby.

8. A current source according to claim 6 wherein each of said switch control means comprises a differential current amplifier, responsive to the related current sensor and to a voltage divider connected to said power supply, and a transistor switch responsive to said amplifier, the output of said transistor switch providing a turn-on signal for the related electronic switch and providing feedback to the related current amplifier to cause it to turn full on or full off in response to variations in current in the related current sensor.

9. A current source according to claim 6 wherein each of said control means comprises a winding magnetically coupled to said inductance and poled with respect to said inductance in such a fashion that an increase in current in said inductance induces a voltage in said winding of a polarity to turn the related electronic switch full on, each winding connected between the related current sensor and electronic switch.

* * * * *